United States Patent [19]

Kamins et al.

[11] Patent Number: 4,810,664
[45] Date of Patent: Mar. 7, 1989

[54] METHOD FOR MAKING PATTERNED IMPLANTED BURIED OXIDE TRANSISTORS AND STRUCTURES

[75] Inventors: Theodore I. Kamins; Jean-Pierre Colinge, both of Palo Alto; Paul J. Marcoux, Mountain View; Lynn M. Roylance, Los Altos; John L. Moll, Palo Alto, all of Calif.

[73] Assignee: Hewlett-Packard Company, Palo Alto, Calif.

[21] Appl. No.: 896,560

[22] Filed: Aug. 14, 1986

[51] Int. Cl.$^4$ .................. H01L 21/76; H01L 21/265
[52] U.S. Cl. ............................. 437/26; 357/23.7; 437/2; 437/24; 437/29
[58] Field of Search .................... 437/24, 26, 29, 2; 357/23.7

[56] References Cited

U.S. PATENT DOCUMENTS

| | | | |
|---|---|---|---|
| 4,412,828 | 11/1983 | Brown et al. | 437/24 |
| 4,465,705 | 8/1984 | Ishihara et al. | 437/26 |
| 4,523,213 | 6/1985 | Konaka et al. | 357/23.7 |
| 4,604,329 | 8/1986 | Reber | 437/24 |
| 4,612,408 | 9/1986 | Moddel et al. | 437/2 |
| 4,633,034 | 12/1986 | Premnath et al. | 437/2 |
| 4,676,841 | 6/1987 | Celler | 437/24 |
| 4,683,637 | 8/1987 | Varker et al. | 437/24 |
| 4,700,454 | 10/1987 | Baerg et al. | 437/24 |
| 4,706,378 | 11/1987 | Havemann | 437/24 |
| 4,717,677 | 1/1988 | McLaughlin et al. | 437/24 |

FOREIGN PATENT DOCUMENTS 2563377 10/1985 France .

OTHER PUBLICATIONS

Arienzo et al., IBM-TDB, 27 (1984) 2371.
"Patterned Implanted Buried-Oxide Transistor Structures" by T. I. Kamins, P. J. Marcous, J. L. Moll, and L. M. Roylance; J. Appl. Phys. 60(1), Jul. 1, 1986, 021/8879/86/130423; p. 423.
"A Self-Aligned Oxygen Implanted SOI (Salox SOI) Technology" By J. C. Tzeng, W. Baerg, C. Ting, B. Siu; 1986 Device Research Conf.
"The Top Silicon Layer of SOI Formed by Oxygen Ion Implantation", By Pinizzotto, Vaandrager, Matteson, Lam and Malhi, IEEE Trans. Nuclear Science, NS-30, 1718 (1983).
"Characterization of Buried SiO$_2$ Layers Formed by Ion Implantation of Oxygen", by S. R. Wilson, J. Electronic Materials 13, 127 (1984).
Characteristics of Submicrometer CMOS Transistors in Implanted-Buried-Oxide SOI Films, by Hashimoto, Kamins, Cham and Chiang, 1985 International Electron Devices Meeting Digest (Washington, DC, Dec. 2–4, 1985), Paper 28.1, p. 672.

Primary Examiner—Upendra Roy
Attorney, Agent, or Firm—Paul L. Hickman

[57] ABSTRACT

A method for producing buried oxide layers in selected portions of a semiconductor substrate including the steps of applying a patterned mask made from a high-density material over a semiconductor substrate and selectively forming buried oxide layers by oxygen ion implantation. The high-density material of the mask is preferably tungsten, but can also be made from other suitable materials such as silicon nitride. A MOS transistor is made by the process of the present invention by applying the high-density mask material over the gate of the transistor, and forming buried oxide layers by ion implantation beneath only the source region and drain region of the transistor. The completed MOS transistor has the characteristics of reduced drain and source capacitance, reduced leakage, and faster response, but does not suffer from the floating-body effect of MOS transistors made by SOI processes.

1 Claim, 6 Drawing Sheets

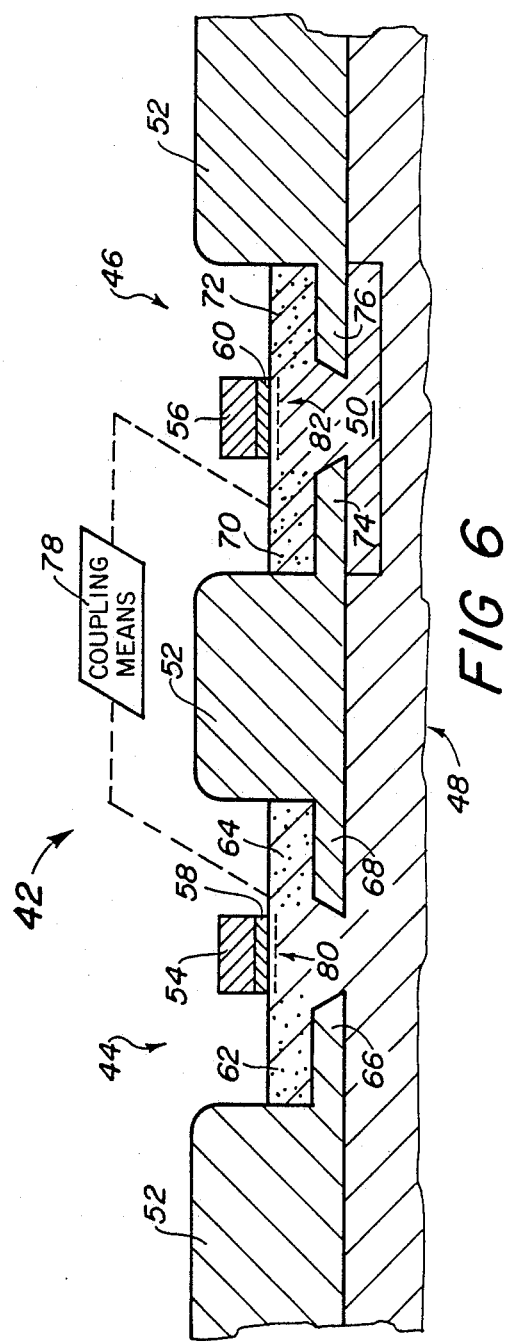
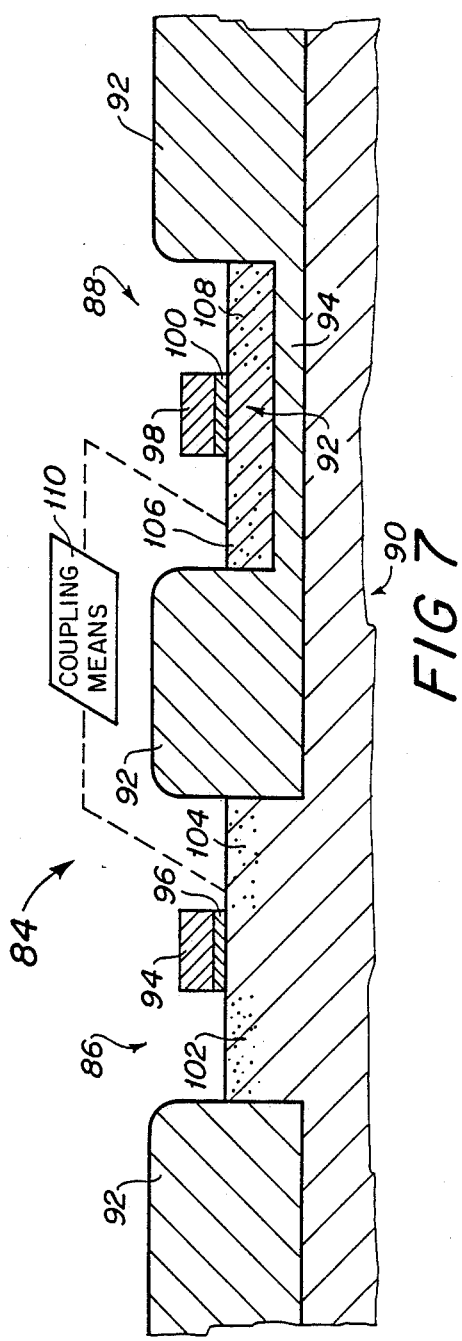

METHOD FOR MAKING PATTERNED IMPLANTED BURIED OXIDE TRANSISTORS AND STRUCTURES

BACKGROUND OF THE INVENTION

1. Field of the Invention

This invention relates generally to the manufacture of integrated-circuits, and more particularly to the manufacture of integrated-circuits using silicon-on-insulator (SOI) techniques.

2. Description of the Prior Art

Many studies have investigated the properties of silicon-on-insulator (SOI) integrated-circuit structures having a buried oxide layer formed by a deep, high-dose oxygen implantation. See, for example, Pinizzotto, et al., *IEEE Trans. Nuclear Science* NS-30, 1718 (1983); Wilson, *Journal of Electronic Materials*, 13, 127 (1984); and Hashimoto, et al., 1985 *International Device Meeting Digest (Washington, D.C., Dec. 2-4, 1985)*, paper 28.1, p. 672. In most of the reported studies, including those cited above, the oxygen has been implanted prior to device processing so that the buried oxide extends under the entire transistor structure, producing a completely dielectrically isolated transistor.

SOI devices have a number of advantages over conventionally formed integrated-circuit devices, including reduced device/substrate capacitance, reduced leakage, and higher speed. However, SOI processing can add to the expense and manufacturing time of an integrated-circuit wafer and can cause operational problems with some types of integrated-circuit devices.

For example, when a MOS transistor having a source, channel, drain, and gate is formed entirely over an insulator, the neutral or body region under the channel is electrically isolated from the substrate and therefore "floats" with respect to the substrate potential. The floating-body of the MOS transistor can acquire a potential which can interfere with the proper functioning of the MOS transistor. Furthermore, the floating-body of a SOI MOS transistor often results in a degradation of the transient response of the transistor.

In a CMOS device an N-channel MOS transistor is coupled to a complementary P-channel MOS transistor to provide a device having very low power requirements. A problem which occurs with CMOS devices, however, is when current flows through the substrate between the complementary MOS transistors causing "latch-up" and possible destruction of the CMOS device. Dielectrically isolating the CMOS device from the substrate eliminates this problem, but introduces the aforementioned floating-body problem, particularly with respect to the N-channel MOS transistor, which is more sensitive than the P-channel MOS transistor to the floating-body effect.

The prior art does not disclose processes or structures which combine the best features of SOI and standard integrated-circuit processes and structures. More particularly the prior art does not disclose a method for implanting a buried oxide layer under selected portions of an integrated-circuit device to selectively isolate portions of the device from the underlying substrate while permitting other portions of the device to remain in electrical contact with the substrate, nor does it disclose structures having patterned, buried oxide layers.

SUMMARY OF THE INVENTION

An object of this invention is to provide a method for implanting a patterned oxide layer in a semiconductor device.

Another object of this invention is to provide an improved MOS transistor having reduced leakage, reduced source and drain capacitance, high-speed operation, and an immunity to the floating-body problem.

Yet another object of this invention is to provide improved CMOS devices which, in addition to having the desirable characteristics described above for the MOS transistor, are highly resistant to latch-up.

A still further object of this invention is to provide a photo-active structure which can be implemented with a selective buried oxide implantation.

Briefly the method of the present invention includes applying a patterned mask formed from a high-density material over a semiconductor wafer, implanting an oxide-forming substance into the wafer substrate, and removing the patterned mask after the implantation step. The high-density material, such as tungsten, has been shown to effectively block oxide formation beneath it, thus forming a patterned, buried oxide layer within the substrate.

By using this method, a MOS transistor can be made having oxide layers formed only under the source and drain portions of the transistor, so that the body region beneath the channel of the transistor remains electrically coupled to the semiconducting substrate of the wafer. This is accomplished by depositing a high-density material, such as tungsten or silicon nitride, over the polysilicon gate of the transistor, and irradiating the structure with a beam of oxygen ions by means of an ion implantation machine. Since the high-density material covers the gate of the MOS transistor, the implanted, buried oxide layers are automatically self-aligned with the gate.

When the method described above is applied to the MOS transistors of a CMOS device, the CMOS device exhibits lower source and drain capacitances, higher speed operation, less leakage, and a higher resistance to the latch-up effect. Furthermore, if a buried oxide layer is formed fully under the P-channel MOS transistor of a CMOS device, the CMOS device becomes totally immune to latch-up, while the N-channel MOS transistor remains in contact with the substrate to avoid the floating-body effect.

The method for producing patterned, implanted buried oxide structures can also be applied to the production of photodiode arrays. For example, a photodiode array comprised of concentric rings or rectangles of alternating P and N polarities can be electrically isolated from the substrate by a buried oxide layer formed just below the array to prevent the rings or rectangles from shorting to the substrate or to each other through the substrate. Furthermore, the photodiode array can be associated with a MOS or bipolar transistor structure. If the photodiode array is associated with a MOS transistor structure, a buried oxide may be selectively formed under the source and drain regions of the transistor, as was previously described.

An advantage of the present invention is that it provides a method for integrated-circuit production which combines the best aspects of conventional and SOI techniques.

Another advantage of this invention is that it provides a method for forming patterned, buried oxide layers within a semiconductor substrate.

Yet another advantage of this invention is that it provides a MOS transistor having lower source and drain capacitances higher speed, less leakage, and an immunity to the floating-body effect.

Yet another advantage of this invention is that it provides a CMOS device which has the same advantages as described above with respect to the MOS transistors and which further has the advantage of reducing or eliminating the possibility of device latch-up.

A still further advantage of this invention is that it describes a method for producing a photo-active structure which is separated from the substrate by a buried oxide layer.

These and other objects and advantages of the present invention will be apparent to those skilled in the art after reading the following descriptions and studying the various figures of the drawing.

BRIEF DESCRIPTION OF THE DRAWINGS

FIG. 6 illustrates a CMOS device produced by the method of the present invention;

FIG. 7 illustrates an alternative CMOS device produced by the method of the present invention.

DETAILED DESCRIPTION OF THE PREFERRED EMBODIMENT(S)

Figure 1:
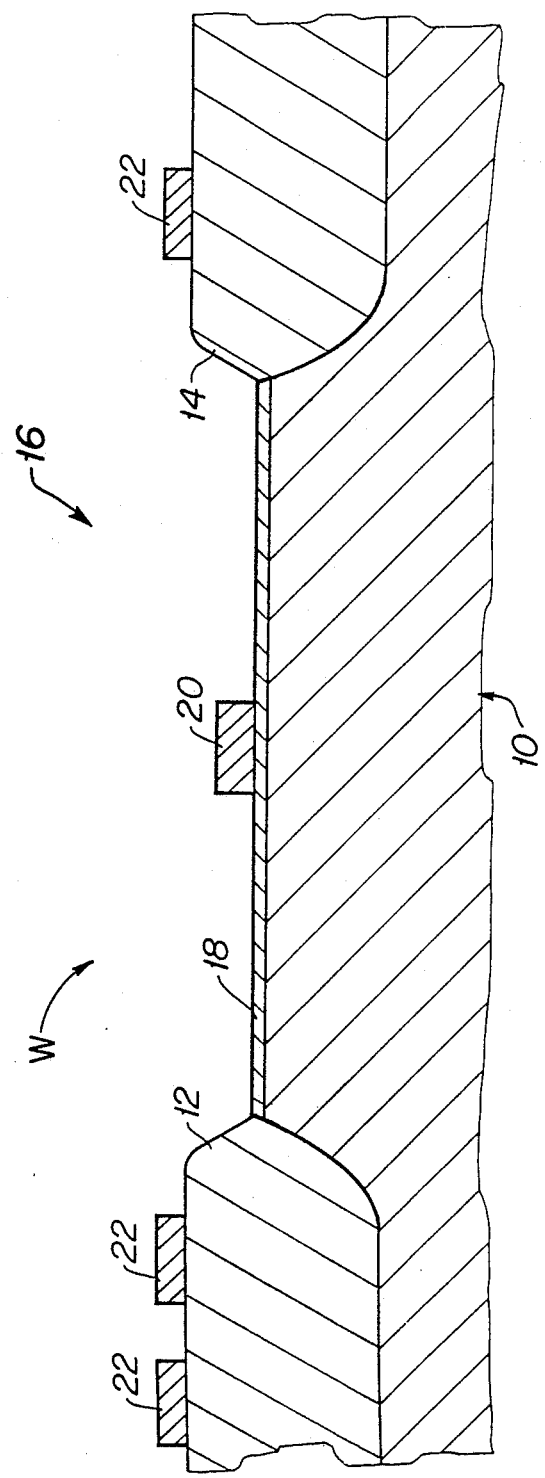
FIG. 1 is a cross-sectional view of a prior art MOS transistor in an intermediate stage of its manufacture.

Referring to FIG. 1, a prior art MOS transistor is shown in an intermediate stage of production. A semiconductor wafer W includes a lightly-doped semiconductor substrate 10, and a pair of field oxide walls 12 and 14 which define the perimeter of the region 16 in which the MOS transistor will be formed. A gate oxide layer 18 is formed over the surface of semiconductor substrate 10 within the confines of field oxide 12 and 14, and a polysilicon gate 20 is formed over the gate oxide layer 18. Polysilicon connection traces 22 are formed on field oxide layers 12 and 14 to connect together the various devices formed in or over the semiconductor substrate 10.

As mentioned previously, the MOS structure described above with reference to FIG. 1 is well-known to those skilled in the art. It should be noted that many publications describe the details of common techniques used in the fabrication process of integrated-circuit components, such as MOS transistors. See, for example, *Semiconductor and Integrated Circuit Fabrication Techniques*, published by Preston Publishing Co., Inc. These techniques can be generally employed in the fabrication of the structure shown in FIG. 1. Furthermore, the individual manufacturing steps can be performed using commercially available integrated-circuit fabrication machines. As will be specifically necessary to an understanding of the improvement of the present invention, approximate technical data for the preferred embodiments that will be discussed subsequently are set forth based upon current technology. Future developments in this art may call for appropriate adjustments, as would be obvious to those skilled in the art.

Referring now to FIGS. 2-5, a process in accordance with the present invention will be described. As mentioned previously, a primary object of the present invention is to develop a patterned, buried oxide layer within a semiconductor substrate to enhance the operation of the devices formed thereon. To accomplish this object, a patterned mask made from a high-density material is applied to the surface of the device to selectively block oxygen implantation.

The material of the patterned mask must block high-dose oxygen ions in the order of $2 \times 10^{18}/cm^2$, and must be able to withstand substrate temperatures of approximately 500° C. It has been found that chemically-vapor-deposited (CVD) tungsten is suitable for this purpose. However, other high-density materials, such as silicon nitride, may also be used as the material for the patterned mask.

Figure 2:
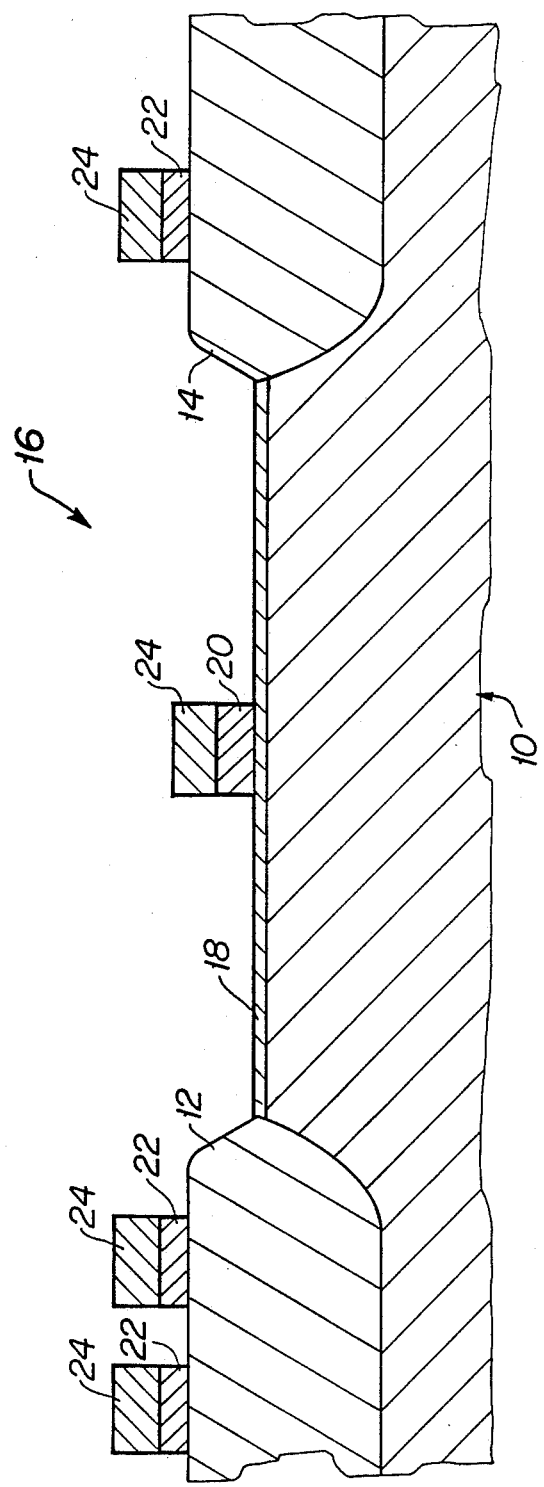
FIG. 2 illustrates the deposition of a high-density, patterned mask over the MOS transistor in accordance with the method of the present invention.

Referring to FIG. 2, a CVD tungsten layer 24 is applied over the polysilicon gate 20 and polysilicon connection paths 22 by standard chemical-vapor-deposition techniques at 300° C. The CVD tungsten layers 24 are preferably at least 200 nm thick. Because of selective nucleation, tungsten does not deposit over the gate oxide layer 18 or the field oxide 12 and 14. Alternatively, a high-density material may be deposited over the polysilicon layer before it is patterned, and both layers may be defined using the same mask.

Figure 3:
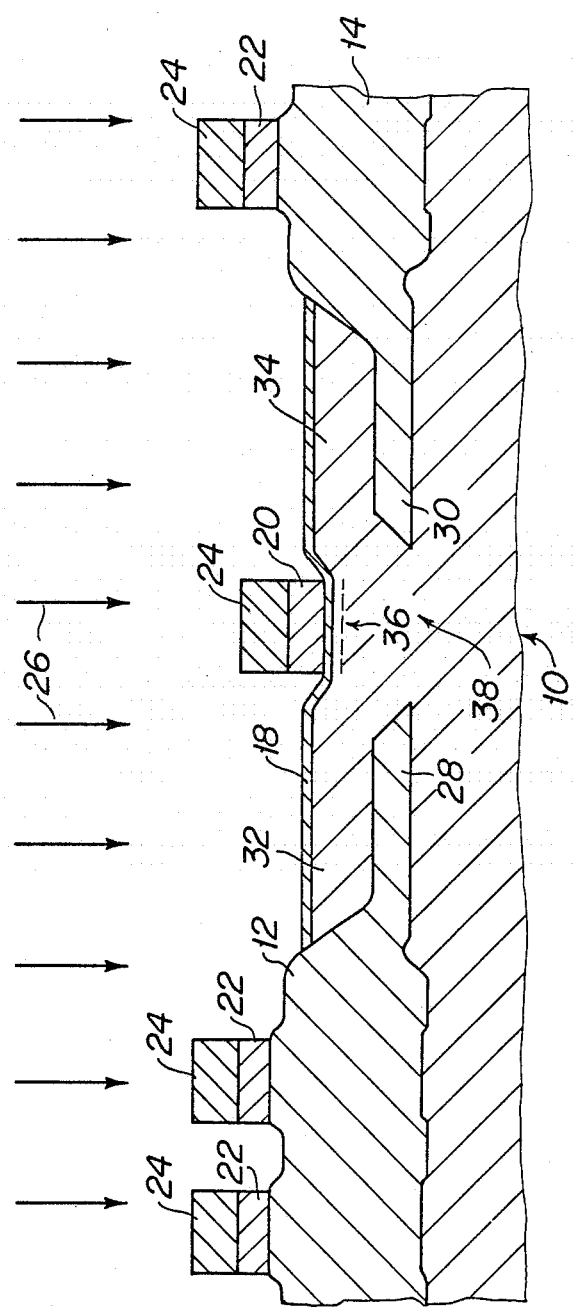
FIG. 3 illustrates the ion-implantation step and shows how the high-density material blocks the formation of buried oxide layer in the underlying substrate.

With reference to FIG. 3, a commercially available ion implant machine is used to irradiate the substrate 10 with atomic oxygen ions or molecular oxygen ions as indicated at 26. The oxygen was implanted with a nominal oxygen dose of $2 \times 10^{18}/cm^2$ at an energy of 180 keV. A nominal substrate 10 temperature of 500° C. was obtained by a combination of external and beam heating. As a result of the oxygen implantation, a buried source oxide layer 28 and a buried drain oxide layer 30 are formed.

It should be noted that, as a side-effect of the oxide implantation, the field oxide 12 and 14 and the gate oxide layer 18 are slightly deformed. For example, the recesses in the upper surfaces of field oxide 12/14 are produced by sputtering effects of the ion beam and the protrusions at the bottom of the field oxide 12/14 are caused by expansion of the field oxide by the implanted ions. Also, the level of the gate oxide layer 18, source region 32, and drain region 34 which were not shielded by CVD tungsten layer 24 and polysilicon gate 20 are raised by the expansion of the substrate 10 due to the formation of the buried oxide layers 28 and 30.

It should also be noted that the deposition of the tungsten layer 24 over the polysilicon gate 20 results in the automatic self-alignment of the the source oxide layer 28 and drain oxide layer 30 with gate 20. In consequence, a MOS transistor of the present invention has a source region 32 and a drain region 34 which are electrically isolated from the substrate 10 by oxide layers 28 and 30, respectively, and a body region beneath channel region 36 electrically coupled to the substrate through an opening 38 between the ends of source oxide layer 28 and drain oxide layer 30.

As a result, a MOS device has been developed which combines the advantages of SOI structures with respect to the source region 32 and the drain region 34 with the advantages of conventional fabrication with respect to the body region beneath the channel region 36. This, in accordance with the objects of the present invention, results in a device with reduced source and drain capacitance, reduced leakage, increased speed, and immunity to the floating-body effect.

Figure 4:
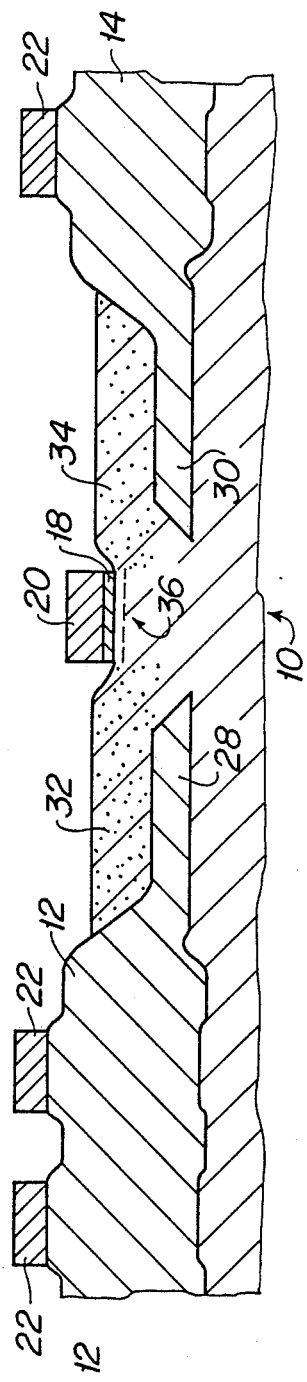
FIG. 4 illustrates the step of doping the source and drain regions of the MOS transistor.
Figure 5:
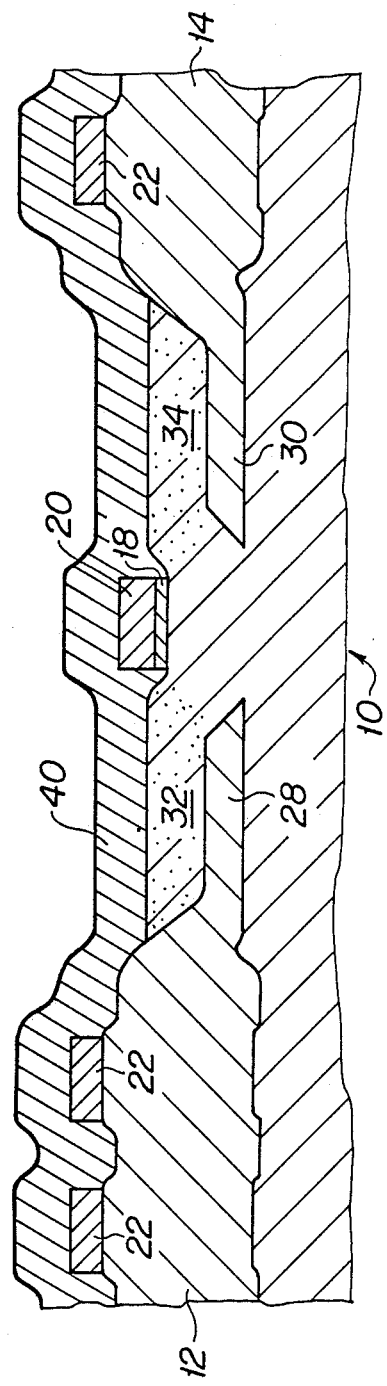
FIG. 5 illustrates the application of the passivation layer.

Referring now to FIG. 4, after oxygen implantation, the tungsten layer 24 over gate 20 and connection traces 22 is removed by etching in warm $H_2O_2$. Other masking materials would be removed by suitable selective etching. The wafer is then annealed at a high temperature, such as at 1125° C. for two hours in an $N_2/1\%O_2$ ambient environment. An arsenic source/drain implant at $6 \times 10^{15}/cm^2$ at 80 keV produces the doping indicated at source region 32 and drain region 34.

Following the arsenic source/drain implant, the wafer is annealed at 1000° C., forming a 16 nm thick layer of oxide. A 500 nm thick layer of undoped, low temperature CVD oxide is then deposited and annealed at 900° C. to form the oxide layer 40 illustrated in FIG. 5. Finally, the metal interconnections (not shown) are deposited, defined and annealed at 450° C. in a hydrogen ambient.

With the MOS transistor described with reference to FIGS. 1-5, the source region 32 and drain region 34 remain in contact with the silicon substrate 10 near the edges of gate 20. Therefore, the entire silicon layer above the buried oxide layers 28 and 30 can become amorphous, and a hot substrate 10 is not required during the implant stage to regain crystallinity. Crystalline regrowth can occur during the post-implant anneal and, furthermore, the single-crystal region only needs to extend a limited distance laterally from the gate electrode 20.

Although photoresist is compatible with implantation using a cooled wafer, it has been found experimentally that photoresist is severely distorted after only a fraction of the desired oxygen dose is implanted, and therefore is not well suited for the process of the present invention. The distortion of the photoresist appears to be caused by the high implant dose, rather than by the heating of the substrate 10 by the ion beam.

Tungsten was found to be suitable as an implant mask because of its high atomic mass and because of its stability at high substrate temperatures. Furthermore, selective deposition provides the added benefit of a self-aligned structure without the complications of etching of a bi-layer gate electrode.

Calculations and experiments suggest that the tungsten layer should be at least 200 nm thick to substantially prevent penetration by the oxygen ions. For example, a 100 nm thick tungsten layer will permit a large fraction of the oxygen ions to penetrate and implant within the gate electrode 20.

While the high-density masking material (tungsten) was applied in the preceding example by CVD, other methods for applying a high-density, patterned mask to the surface of the wafer are also available. For example, a uniform layer of tungsten could be applied to the wafer, and then a photoresist layer could be applied over the tungsten. After exposing and developing the photoresist layer, the tungsten layer could be patterned by an etching process (such as by etching with warm $H_2O_2$ or by a dry etching process) and the photoresist subsequently removed. By this method, a high-density patterned mask of virtually any configuration can be produced.

In FIG. 6, a CMOS device 42 includes a first MOS transistor 44 and a second MOS transistor 46. For the purpose of discussion, it will be assumed that first MOS transistor 44 is an N-channel MOS transistor, and that second MOS transistor 46 is a P-channel transistor. Of course, it is only required that transistor 44 and 46 be of opposite polarities, such that transistor 44 could be a P-channel transistor and transistor 46 could be an N-channel transistor.

Still referring to FIG. 6, the substrate 48 will be, for the purpose of discussion, assumed to be of P-type material and provided with a well region 50 of N-type material. Field oxide 52 provides walls to separate MOS transistors 44 and 46 from each other and other adjacent devices. Polysilicon gates 54 and 56 of transistors 44 and 46, respectively, are separated from an upper surface of substrate 48 by gate oxide layers 58 and 60, respectively.

MOS transistor 44 has a source region 62 and a drain region 64 which are separated from the main body of the substrate 48 by buried oxide layers 66 and 68, respectively. Similarly, transistor 46 has a source region 70 and a drain region 72 which are provided with buried oxide layers 74 and 76, respectively. The buried oxide layers 66, 68, 74, and 76 are produced by the method explained previously with reference to FIGS. 1-5.

In FIG. 6, the metal connections between transistors 44 and 46 which couple the CMOS device together are not shown, nor are the necessary passivation layers. However, the interconnection of MOS transistors to form a CMOS device is well known to those skilled in the art, and their connection is suggested by a block 78 labeled "coupling means".

The CMOS device 42 illustrated in FIG. 6 has several major advantages over CMOS devices of the prior art. Firstly, the buried oxide layers 66, 68, 74, and 76 reduce source and drain capacitances, provide for faster device operation, and reduce leakage. Furthermore, the body regions beneath channel areas 80 and 82 of the transistors 44 and 46, respectively, are electrically coupled to the substrate 48 to prevent the floating-body effect. Finally, the buried oxide layer 68 of the first MOS transistor 44 and the buried oxide layer 74 of the second MOS transistor 46 increase the electrical path length between the active regions of transistors 44 and 46, thereby reducing the chance of latch-up.

In FIG. 7, an alternate embodiment of a CMOS device 84 is shown, including a first MOS transistor 86 and a second MOS transistor 88. In this embodiment, the substrate 90 will be assumed to be made from a P-type material, while the well region 92 will be assumed to be made from an N-type material. The CMOS device 84 includes field oxide 92, and a buried oxide layer 94 which is formed fully under transistor 88 to electrically isolate it from the substrate 90.

Transistor 86 is provided with a gate 94 and gate oxide 96, while transistor 88 is provided with a gate 98 and gate oxide 100. The source region 102 and drain region 104 of transistor 86 and the source region 106 and drain region 108 of transistor 88 are doped by implantation, as was previously described.

It will be noted that transistor 86 is not provided with a buried oxide layer, as was the case with the previous embodiments. This is because the buried oxide layer 94 formed fully under transistor 88 will totally avoid latch-up problems, reducing the need for buried oxide under transistor 86. However, the buried oxide layers could still be provided beneath the source and drain regions of transistor 86 to reduce capacitance.

Since transistor 86 is an N-channel MOS transistor, it would be undesirable to form an oxide layer fully under the transistor due to the aforementioned floating-body effect P-channel MOS transistors, such as transistor 88, are generally less troublesome as far as floating-body effects, and can safely be manufactured as SOI structures.

The coupling between transistors 86 and 88 to complete the CMOS device 84 is suggested by a block 110 labelled "coupling means". As before, the actual interconnections of a complementary pair of MOS transistors to form a CMOS device are well known to those skilled in the art. Also, the passivation layer has been omitted from the CMOS device 84 to simplify the description.

Figure 8:
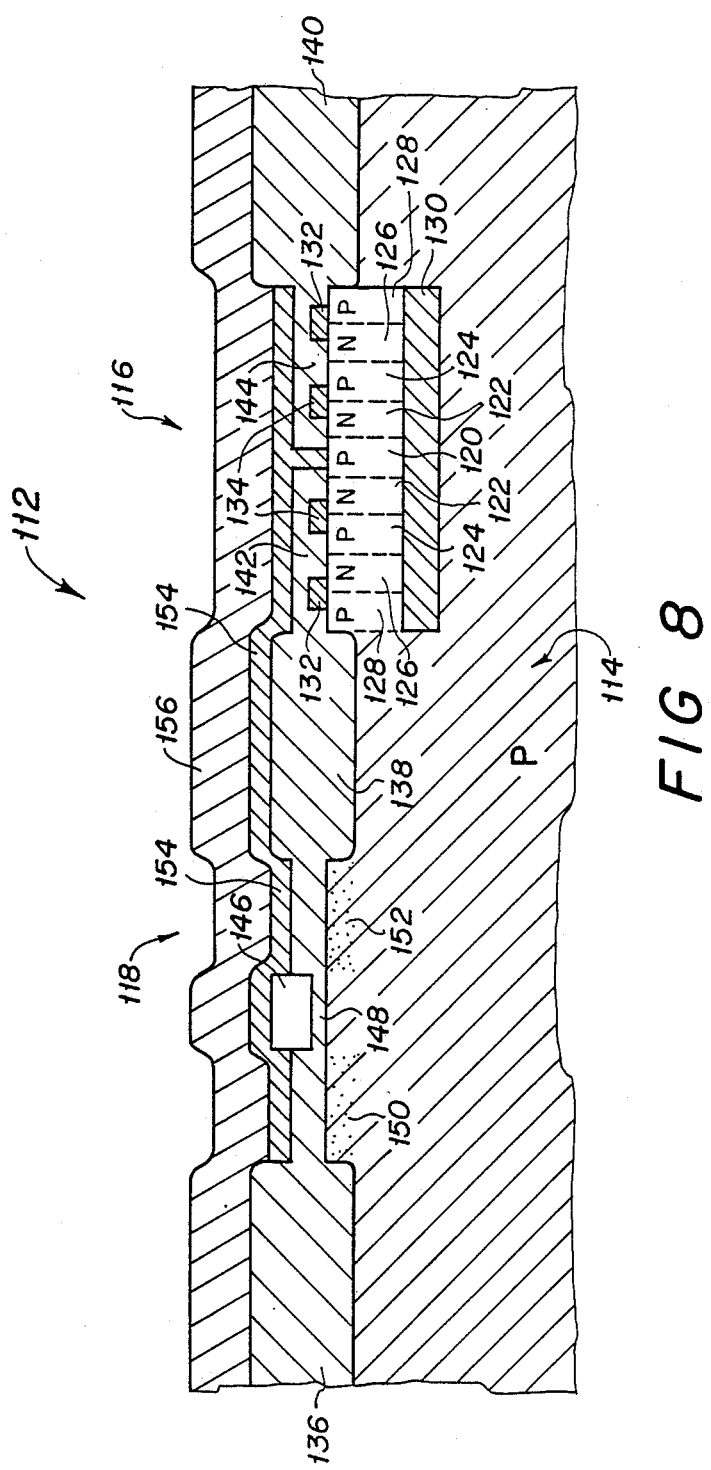
FIG. 8 illustrates a photo-active device formed by the method of the present invention.

Referring now to FIG. 8, a photo-active device 112 includes a substrate 114, a photodiode array 116, and a MOS transistor 118. Of course, a bipolar transistor could equally well be associated with the photodiode array 116. For the purpose of discussion, it will be assumed that substrate 114 is made from a P-type material.

Photodiode array 116 includes a core 120 of P type material surrounded by concentric rings or rectangles 122, 124, 126, and 128. The concentric rings or rectangles 122-128 alternate in conductivity type to produce a series of P-N junctions. Core 120 and rectangles 122-128 are isolated, at their base, from the substrate 114 by a buried oxide layer 130 formed by the method of the present invention that was described previously with reference to FIGS. 1-5. An epitaxial layer may additionally be grown to provide a thicker silicon layer.

Rectangles 126 and 128 are electrically coupled together by a conductor 132, and concentric rectangles 122 and 124 are electrically coupled together by conductive traces 134. Field oxide 136, 138, and 140 separate the photodiode array 116 from MOS transistor 118 and from adjacent devices. Rectangle 128 of P-type material may be in contact with substrate 114.

The buried oxide layer 130 produced by the method of the present invention prevents the core 120 and concentric, ring or rectangle regions 122-128, from shorting together through the substrate 114. Oxide layers 142 and 144 prevent a similar shorting at their upper surface.

MOS transistor 118 can be of conventional design and includes a polysilicon gate 146, gate oxide 148, a source region 150 and a drain region 152. The MOS transistor 118 can be fabricated by conventional techniques. A metal trace 154 couples the gate 146 of MOS transistor 118 to core 120 of the photodiode array 116, and a passivation layer 156 is formed both over the photodiode array 116 and the MOS transistor 118. It should be noted that the source and drain connections of transistor 118 are not shown in this figure for the purpose of simplification.

Passivation layer 156 and oxide layers 142 and 144 are made from an insulating substance which is transparent to electromagnetic radiation at a desired frequency. Electromagnetic radiation striking the alternating P-N junctions of the photodiode array 116 produces an electric potential at the core 120 with respect to rectangle 128. The electric signal developed by photodiode array 116 is amplified by MOS transistor 118 to perform a useful purpose.

Thus far, methods for producing patterned, buried oxide layers have been discussed. These buried oxide layers have been formed by implanting oxide forming substances such as oxygen ions, oxygen molecules, or other oxygen compounds beneath the surface of a substrate. However, it should be apparent to those skilled in the art that other implanted substances can form buried insulation layers for similar purposes. For example, nitrogen can be implanted into a silicon substrate to form insulating layers of silicon nitride. Furthermore, the methods of the present invention can be used with other types of semiconducting substrates, such as germanium or gallium-arsenide substrates.

The foregoing description of the preferred embodiments of the present invention have been presented for purposes of illustration and description. They are not intended to be exhaustive, or to limit the invention to the precise forms disclosed. Obviously, many modifications and variations will be apparent to practitioners skilled in this art. It is possible that the invention may be practiced in many fabrication technologies in the bipolar and MOS processes. Any process steps described might be interchangeable with other steps in order to achieve the same result. The embodiments were chosen and described in order to best explain the principles of the invention and their practical applications, thereby enabling others skilled in the art to understand the invention. It is intended that the scope of the invention be defined by the claims appended hereto and to their equivalents.

What is claimed is:

1. A method for producing a photo-active structure, the method comprising the steps of:
    (a) creating photo-electric generation means in a semiconductor substrate;
    (b) directing an energized beam of an oxide-forming substance towards the substrate to form a buried, implanted oxide layer beneath the photo-electric generation means;
    (c) applying a patterned mask of high-density materials to a surface of the substrate to selectively block the implantation of an oxide layer at locations other than beneath the photo-electric generation means;
    (d) forming transistor means proximate to the photo-electric generation means; and
    (e) coupling the photo-electric generation means to the transistor means.

* * * * *

UNITED STATES PATENT AND TRADEMARK OFFICE
CERTIFICATE OF CORRECTION

PATENT NO. : 4,810,664
DATED : March 7, 1989
INVENTOR(S) : Theodore Kamins et al.

It is certified that error appears in the above-identified patent and that said Letters Patent is hereby corrected as shown below:

In Column 3, Line 6, "capacitances higher" should read --- capacitances, higher --- ;

In Column 7, Line 6, "effect P channel" should read --- effect.   P channel --- .

Signed and Sealed this

Twentieth Day of August, 1991

Attest:

HARRY F. MANBECK, JR.

Attesting Officer

Commissioner of Patents and Trademarks